United States Patent
Kang (10) Patent No.: US 8,971,037 B2
(45) Date of Patent: Mar. 3, 2015

(54) COOLING APPARATUS AND DISPLAY DEVICE HAVING THE SAME

(75) Inventor: Joon Kang, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 619 days.

(21) Appl. No.: 13/304,054

(22) Filed: Nov. 23, 2011

(65) Prior Publication Data

US 2012/0160452 A1  Jun. 28, 2012

(30) Foreign Application Priority Data

Dec. 27, 2010 (KR) .................. 10-2010-0135440

(51) Int. Cl.
*H05K 5/00* (2006.01)
*H05K 7/00* (2006.01)
*H01L 23/427* (2006.01)
*H05K 7/20* (2006.01)
*H01L 23/467* (2006.01)

(52) U.S. Cl.
CPC .......... *H01L 23/427* (2013.01); *H05K 7/20963* (2013.01); *H05K 7/20972* (2013.01); *H01L 23/467* (2013.01)
USPC .................. 361/679.47; 361/695; 361/679.46

(58) Field of Classification Search
USPC ................................ 361/679.46, 679.47, 695
See application file for complete search history.

(56) References Cited

U.S. PATENT DOCUMENTS

| | | | | |
|---|---|---|---|---|
| 6,804,115 B2 * | 10/2004 | Lai | ................................ | 361/695 |
| 6,871,702 B2 * | 3/2005 | Horng et al. | .............. | 165/104.33 |
| 7,079,394 B2 * | 7/2006 | Mok | .............................. | 361/700 |
| 7,254,023 B2 * | 8/2007 | Lu et al. | ......................... | 361/698 |
| 7,457,125 B2 * | 11/2008 | Kim | .............................. | 361/715 |
| 7,492,589 B2 * | 2/2009 | Park | .............................. | 361/695 |
| 7,529,090 B2 * | 5/2009 | Peng et al. | ..................... | 361/700 |
| 7,643,284 B2 * | 1/2010 | Nakamura | ............... | 361/679.47 |
| 7,684,187 B1 * | 3/2010 | Meyer et al. | ............. | 361/679.47 |
| 7,903,402 B2 * | 3/2011 | Tomioka et al. | ......... | 361/679.47 |
| 7,965,512 B2 * | 6/2011 | Huang et al. | ................... | 361/700 |
| 8,016,558 B2 * | 9/2011 | Chen | .......................... | 415/214.1 |
| 8,369,084 B2 * | 2/2013 | Chen et al. | ............... | 361/679.55 |
| 8,448,694 B2 * | 5/2013 | Sun et al. | ................. | 165/80.3 |
| 8,514,574 B2 * | 8/2013 | Fu et al. | ......................... | 361/697 |
| 8,787,013 B1 * | 7/2014 | Czamara et al. | ......... | 361/679.47 |
| 8,837,138 B2 * | 9/2014 | Wiltzius et al. | ........... | 361/679.46 |
| 8,861,202 B2 * | 10/2014 | Nassoiy | ......................... | 361/701 |
| 2005/0094371 A1 * | 5/2005 | Lai | ................................ | 361/687 |
| 2005/0276018 A1 * | 12/2005 | Moore et al. | .................. | 361/695 |
| 2008/0151500 A1 * | 6/2008 | Liang et al. | ................... | 361/697 |

* cited by examiner

*Primary Examiner* — Anthony Haughton
(74) *Attorney, Agent, or Firm* — Sughrue Mion, PLLC (57) ABSTRACT

Provided herein are a display device and a cooling apparatus, the cooling apparatus including an impeller which sucks a fluid in an axial direction, and which discharges the fluid in a radial direction; a pair of radiation blocks, which are respectively disposed at each side of the impeller, wherein each of the radiation blocks includes a plurality of radiation fins; and a plurality of scroll units which guide the fluid discharged from the impeller to the pair of radiation blocks, wherein each of the scroll units includes a first scroll part which guides the fluid based on a rotating direction of the impeller, and a second scroll part which guides the fluid so in a direction opposite to the rotating direction of the impeller.

13 Claims, 9 Drawing Sheets

COOLING APPARATUS AND DISPLAY DEVICE HAVING THE SAME

CROSS-REFERENCE TO RELATED APPLICATION

This application claims priority from Korean Patent Application No. 10-2010-0135440, filed on Dec. 27, 2010 in the Korean Intellectual Property Office, the disclosure of which is incorporated herein by reference.

BACKGROUND

1. Field

Exemplary embodiments of the present inventive concept relate to a central processing unit (CPU) cooling apparatus having a slim structure and a display device having the same.

2. Description of the Related Art

In general, display devices, such as a television (TV) and a computer monitor, serve to form images.

Particularly, digital information display (DID) devices refer to display devices used for the purpose of advertisement and information provision.

In most cases, a DID device uses a separate computing system to achieve usage purpose and management, such as a high performance CPU or computer system.

Further, long-term reliability needs to be guaranteed in terms of characteristics of the DID device, and heat radiation is a factor most highly influencing such reliability.

However, if the length of radiation fins is increased so as to satisfy a slim structure, a flow resistance is increased and a flow rate is substantially decreased.

Further, a cooling area substantially contributing to cooling is greatly decreased due to temperature rise of a cooling fluid in a downstream part of the device, thus lowering a cooling capacity of the device.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

According to another aspect of the present inventive concept, there is provided a display device having a display panel, wherein the device may include: a display panel which displays an image; at least one heat generating body; and a cooling apparatus comprising a cooling fan which discharges a fluid sucked from a front area of the cooling apparatus to both sides of the cooling apparatus, a pair of radiation blocks respectively disposed at each side of the cooling fan, wherein each radiation block includes a plurality of radiation fins and a pair of heat pipes which transmit heat generated from the at least one heat generating body to the pair of the radiation blocks.

The cooling fan may include an impeller which sucks the fluid in an axial direction, and discharges the fluid in a radial direction, and a plurality of scroll units which guide the fluid discharged from the impeller to the pair of radiation blocks.

Each of the scroll units may include a first scroll part which guides the fluid based on a rotating direction of the impeller, and a second scroll part which guides the fluid in a direction opposite to the rotating direction of the impeller.

Each of the scroll units may further include a protrusion protruding inwardly, wherein the first scroll part is at one side of the protrusion and the second scroll part is at another side of the protrusion.

A curvature of an inner wall of each of the first and second scroll parts may decrease with increasing distance from the protrusion.

The cooling apparatus may further include a housing on which the cooling fan and the pair of radiation blocks are disposed; and wherein a suction port is at a center of a front surface of the housing, and a pair of exhaust ports is at both sides of the front surface of the housing.

Side ends of the rear surface of the housing may be curved so that the fluid is exhausted at an incline through the exhaust ports.

The rear surface of the housing may include openings which expose the pair of radiation blocks to the display panel.

The at least one heat generating body may include a first heat generating body and a second heat generating body, and wherein the pair of heat pipes may include a first heat pipe and a second heat pipe.

According to another aspect of the present inventive concept, there is provided a cooling apparatus which may include: a cooling fan which discharges a fluid sucked from a front area of the cooling apparatus, to both sides of the cooling apparatus; a pair of radiation blocks respectively disposed at each of the both sides of the cooling fan, wherein each of the radiation blocks includes a plurality of radiation fins; and a pair of heat pipes which transmit heat generated from at least one external heat generating body to the pair of radiation blocks.

The cooling fan may include an impeller which sucks the fluid in an axial direction and discharges the fluid in a radial direction, and wherein the cooling fan further includes a plurality of scroll units which guide the fluid discharged from the impeller to the pair of radiation blocks.

Each of the scroll units may include a first scroll part which guides the fluid based on a rotating direction of the impeller, and a second scroll part which guides the fluid in a direction opposite to the rotating direction of the impeller.

Each of the scroll units may further include a protrusion protruding inwardly, wherein the first scroll part is formed at one side of the protrusion, and wherein the second scroll part is formed at another side of the protrusion.

A curvature of an inner wall of each of the first and second scroll parts may decrease with increasing distance from the protrusion.

According to another aspect of the present inventive concept, there is provided a cooling apparatus which may include: an impeller which sucks a fluid in an axial direction, and which discharges the fluid in a radial direction; a pair of radiation blocks, which are respectively disposed at each side of the impeller, wherein each of the radiation blocks includes a plurality of radiation fins; and a plurality of scroll units which guide the fluid discharged from the impeller to the pair of radiation blocks, wherein each of the scroll units includes a first scroll part which guides the fluid based on a rotating direction of the impeller, and a second scroll part which guides the fluid so in a direction opposite to the rotating direction of the impeller.

BRIEF DESCRIPTION OF THE DRAWINGS

These and/or other aspects of the present inventive concept will become apparent and more readily appreciated from the following description of the exemplary embodiments, taken in conjunction with the accompanying drawings of which.

DETAILED DESCRIPTION

Reference will now be made in detail to the exemplary embodiments of the present inventive concept, examples of which are illustrated in the accompanying drawings, wherein like reference numerals refer to like elements throughout.

Figure 1:
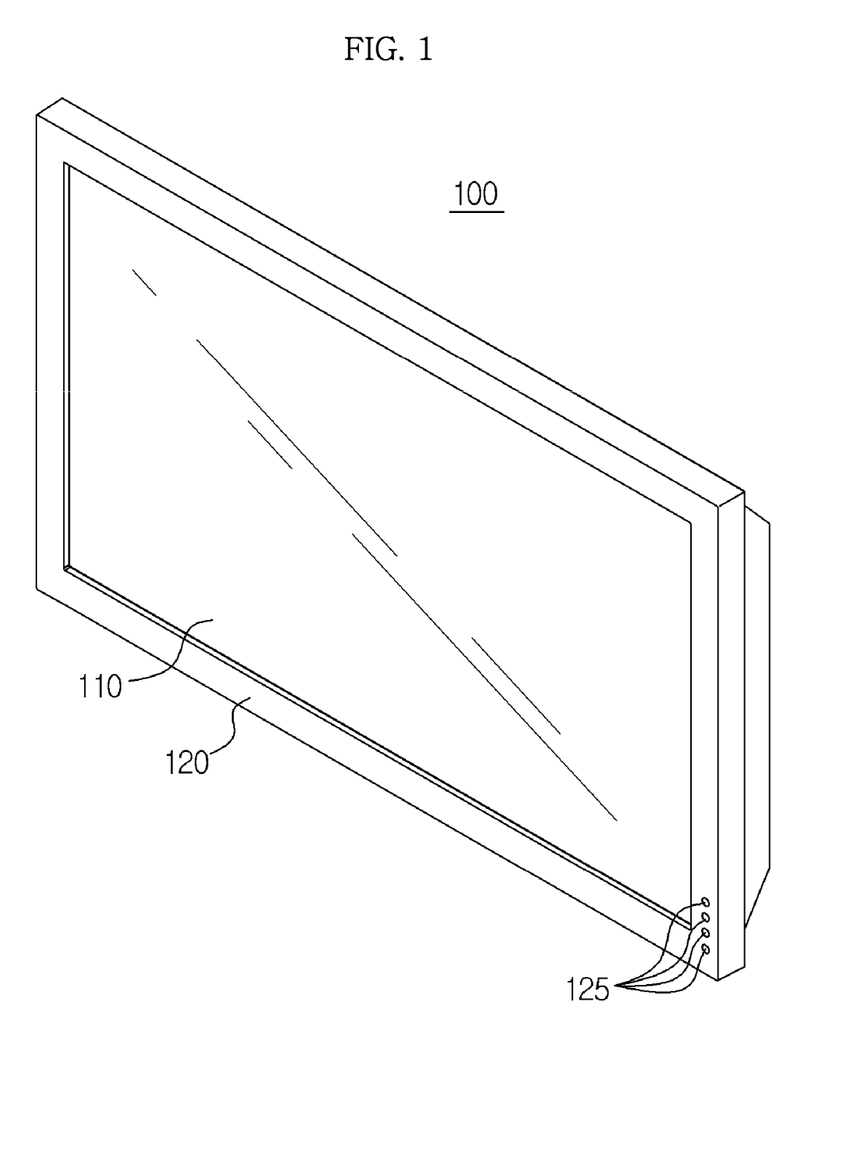
FIG. 1 is a perspective view illustrating the front surface of a display device in accordance with an exemplary embodiment of the present inventive concept.
Figure 2:
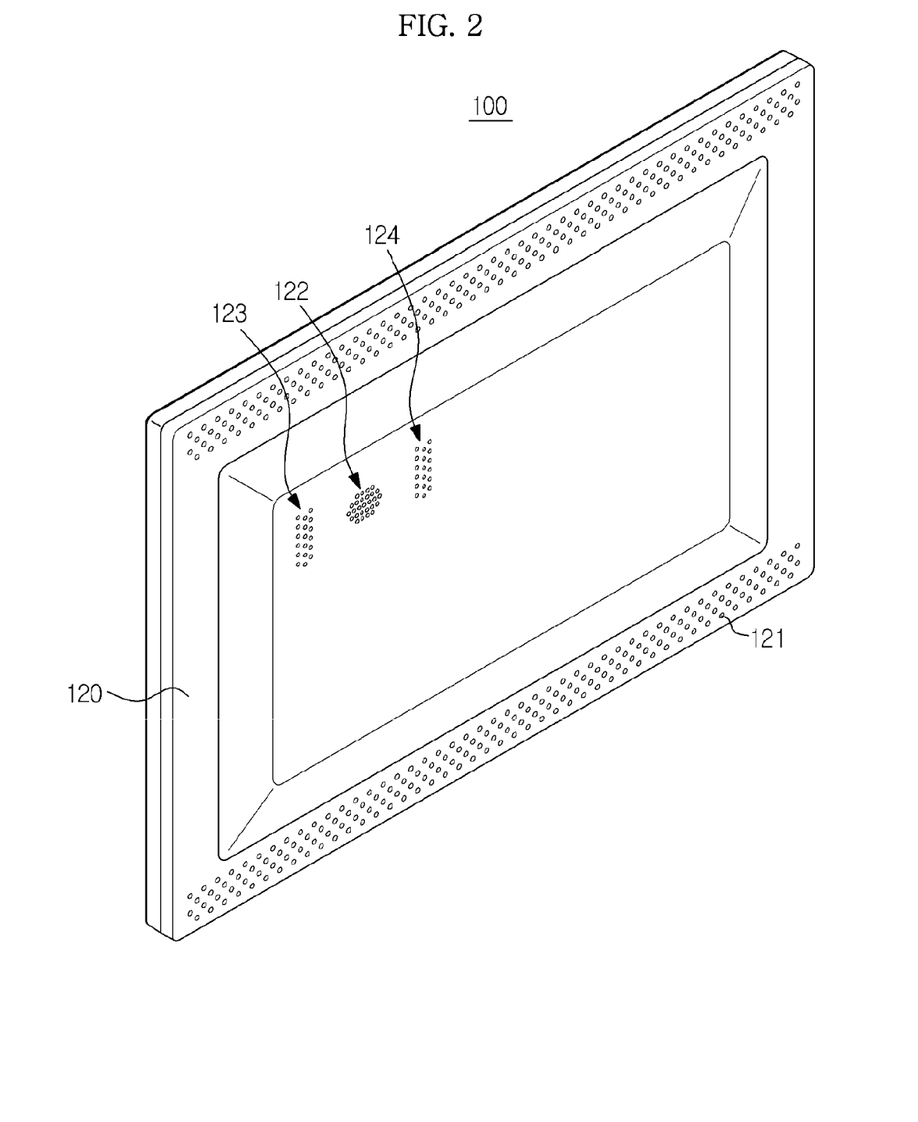
FIG. 2 is a perspective view illustrating the rear surface of the display device, an example of which is shown in FIG. 1.
Figure 3:
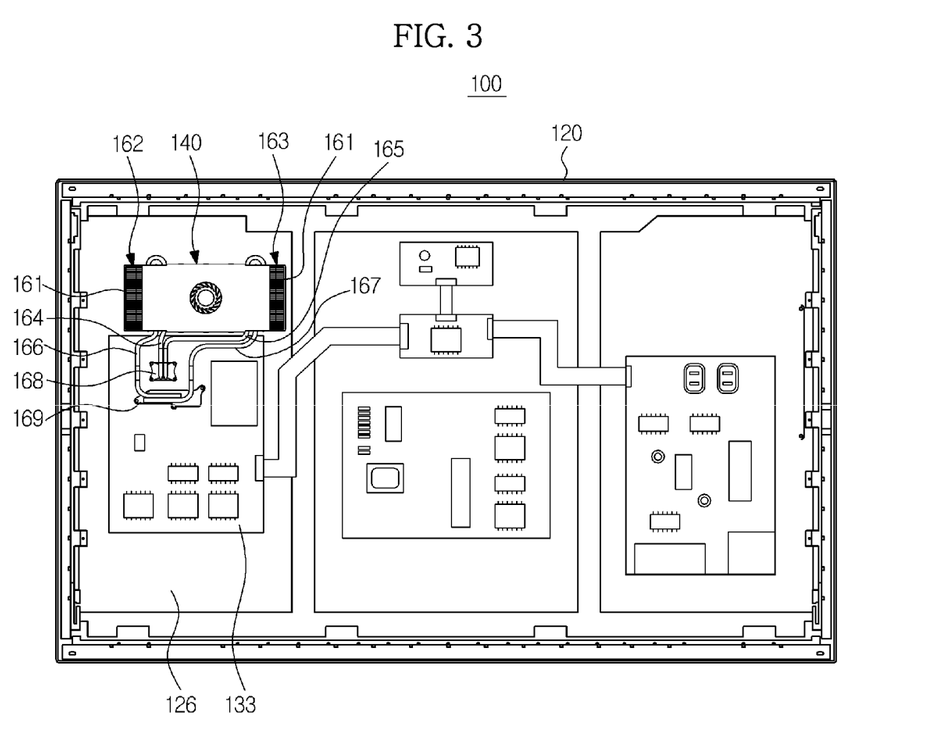
FIG. 3 is a view illustrating the inside of the rear surface of the display device, an example of which is shown in FIG. 1.

FIG. 1 is a perspective view illustrating the front surface of a display device in accordance with one exemplary embodiment of the present inventive concept, FIG. 2 is a perspective view illustrating the rear surface of the display device of FIG. 1, and FIG. 3 is a view illustrating the inside of the rear surface of the display device of FIG. 1.

As shown in FIGS. 1 to 3, a display device 100 in accordance with the exemplary embodiment of the present inventive concept includes a display panel 110, heat generating bodies 130, 131 and 132 and a cooling apparatus 140.

The display device 100 further includes a casing 120 to accommodate the display panel 110, the heat generating bodies 130, 131 and 132 and the cooling apparatus 140 and to form the external appearance of the display device 100. An operation unit 125 to control operation of the display panel 110 is provided on the casing 120, and vent holes 121 to circulate air are formed on the casing 120 so as to cool the display panel 110. Further, an inlet 122 and outlets 123 and 124 are provided at positions of the casing 120 corresponding to a suction port 144 and exhaust ports 145 and 146 of the cooling apparatus 140 so that air is sucked into and exhausted from the cooling apparatus 140 therethrough. A detailed description thereof will be given later.

Although not shown in the drawings, the display panel 110 includes a display unit to form a screen by adjusting arrangement of a liquid crystal layer and a light source unit located on the rear surface of the display unit to supply light to the display unit, thus forming an image. The display panel 110 may include a chassis to accommodate and support the display unit and the light source unit.

The display device 100 further includes main body unit 126 performing various functions to drive the display panel 110 or to provide network data and connected to the rear portion of the display panel 110.

Various printed circuit boards 133 are installed on the main body unit 126, and control units executing functions while receiving/transmitting data are mounted on the printed circuit boards 133. Such control units include the heat generating units 130, 131 and 132 which generate a large amount of heat during operation thereof.

The heat generating units 130, 131 and 132 include a central processing unit (CPU) 130 and memory control hubs (MCHs) 131 and 132 which are a kind of system controller connecting the CPU 130 to a peripheral component interconnect (PCI) bus, such as a northbridge or a southbridge.

The cooling apparatus 140 is installed so as to remove heat generated from the heat generating units 130, 131 and 132.

Figure 4:
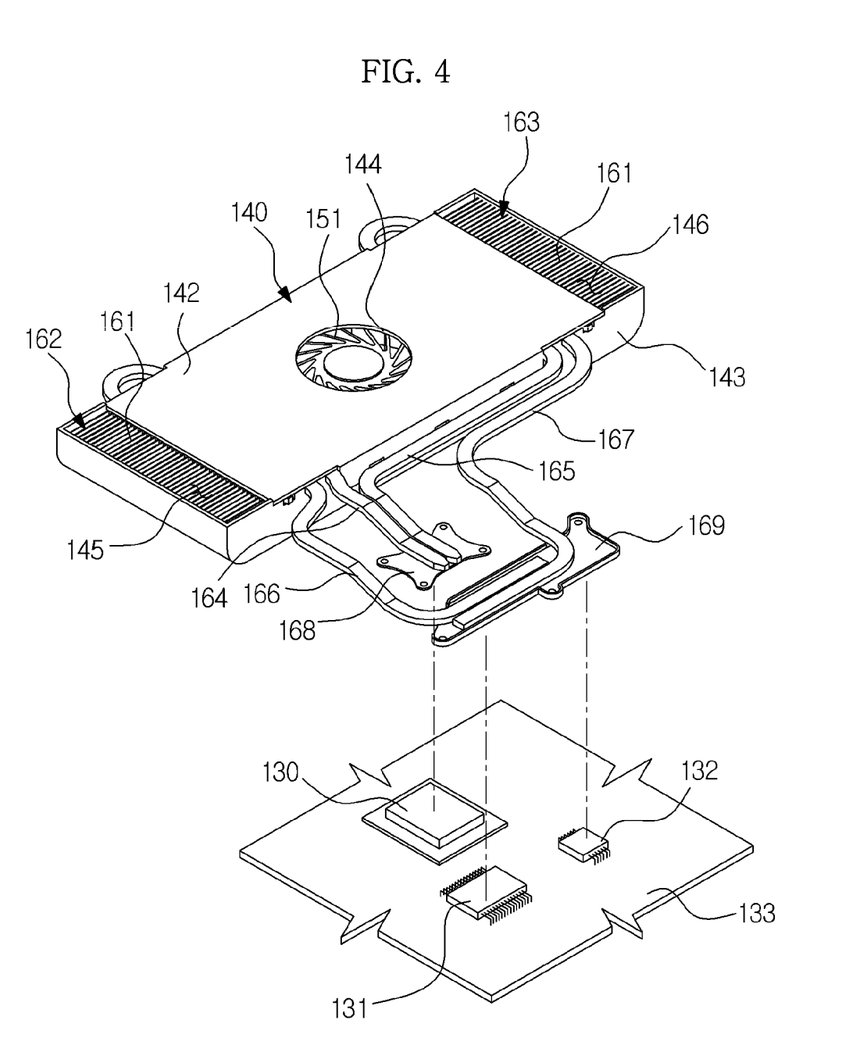
FIG. 4 is a perspective view illustrating a cooling apparatus in accordance with one exemplary embodiment of the present inventive concept.
Figure 5:
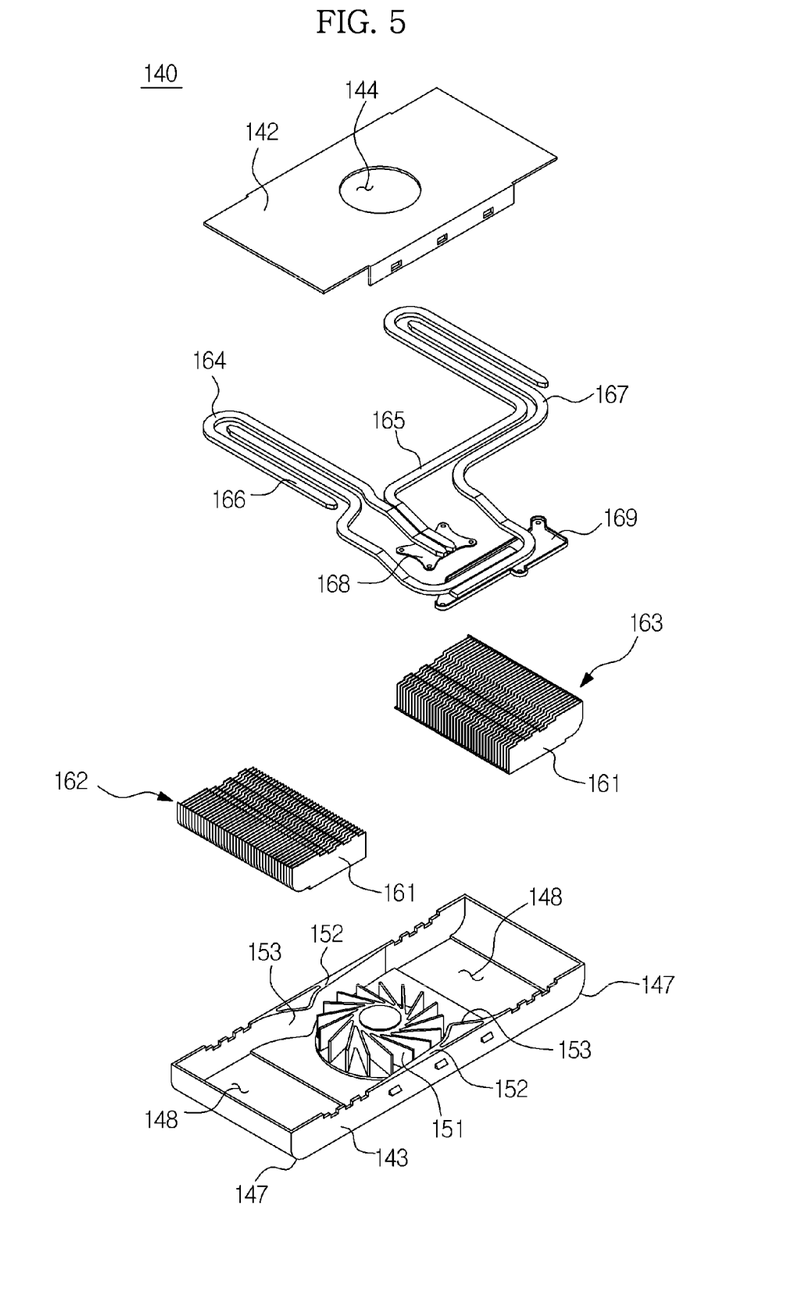
FIG. 5 is an exploded perspective view illustrating a configuration of the cooling apparatus, an example of which is shown in FIG. 4.
Figure 6:
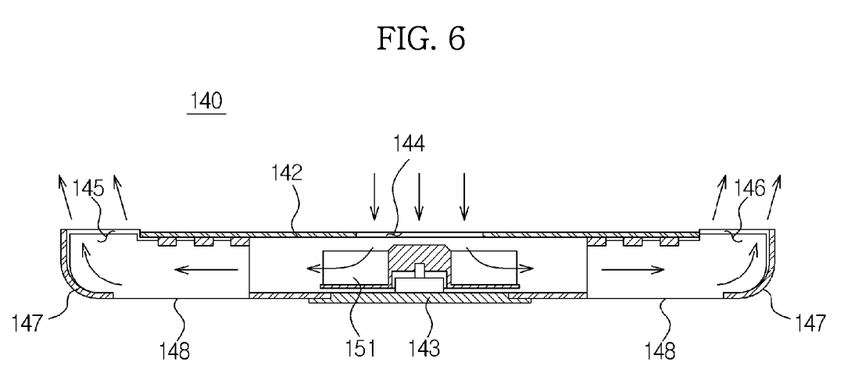
FIG. 6 is a cross-sectional view illustrating air flow in the cooling apparatus, an example of which is shown in FIG. 4.

FIG. 4 is a perspective view illustrating a cooling apparatus in accordance with one exemplary embodiment of the present inventive concept, FIG. 5 is an exploded perspective view illustrating a configuration of the cooling apparatus of FIG. 4, and FIG. 6 is a cross-sectional view illustrating air flow in the cooling apparatus, an example of which is shown in FIG. 4.

Hereinafter, with reference to FIGS. 4 to 6, the configuration of the cooling apparatus 140 will be described.

The cooling apparatus 140 includes an impeller 151, scroll units 152, radiation blocks 162 and 163 and heat pipes 164, 165, 166 and 167.

The cooling apparatus 140 further includes a housing 141 on which the scroll units 152 are formed and the impeller 151 and the radiation blocks 162 and 163 are installed.

The housing 141 includes a rear cover 143 having an approximate box shape, the upper surface of which is opened, and a front cover 142 provided to cover the opened upper surface of the rear cover 143.

The suction port 144 is formed at the center of the front cover 142 so that a fluid is sucked into the housing 141 through the suction port 144.

Further, the length of the front cover 142 is set to be slightly shorter than the length of the rear cover 143 so that parts of the opened upper surface of the rear cover 143 which are not covered by the front cover 142 function as the exhaust ports 145 and 146 through which the fluid is exhausted to the outside of the housing 141. These exhaust ports 145 and 146 are formed at both sides of the front surface of the housing 141.

Side ends of the rear cover 143 are rounded so that the fluid is exhausted at an incline, e.g., upward, and in the outward direction through the exhaust ports 145 and 146 and the exhausted fluid is not sucked back into the housing 141 through the suction port 144. Further, such a configuration enables the exhausted fluid to be effectively exhausted through the exhaust ports 145 and 146 without high resistance.

Openings 148 having a designated size are provided on the rear cover 143 so that the radiation blocks 162 and 163, which will be described later, directly contact the main body unit 126 or the printed circuit boards 133 so as to exchange heat.

The impeller 151 sucks the fluid in the axial direction and then discharges the fluid in the radial direction. The impeller 151 is installed on the housing 141 so as to suck the fluid into the suction port 144.

The first and second radiation blocks 162 and 163 for heat exchange are installed at both sides of the housing 141 in the lengthwise direction. The first and second radiation blocks 162 and 163 are formed by stacking a plurality of radiation fins 161 at a regular interval. The radiation fins 161 are stacked in parallel with a flowing direction of the fluid blown by the impeller 151 so as to reduce a flow resistance of the fluid.

The first and second radiation blocks 162 and 163 may be formed by fixing the plural radiation fins 161 using separate jigs and then soldering the plural radiation fins 161 to the lower surfaces of the heat pipes 164, 165, 166 and 167 provided to transmit heat generated from the heat generating bodies 130, 131 and 132 to the first and second radiation blocks 162 and 163.

The heat pipes 164, 165, 166 and 167 include a first heat pipe 164 connecting a CPU base 168 to the first radiation block 162, and a second heat pipe 165 connecting the CPU base 168 to the second radiation block 163. Here, the CPU base 168 is a terminal contacting the CPU 130.

Through such a pair of the first and second heat pipes 164 and 165, the two radiation blocks 162 and 163 simultaneously remove heat generated from the CPU 130, and thus the length of the radiation fins 161 may be decreased and the cooling capacity of the radiation fins 161 may be improved.

The heat pipes 164, 165, 166 and 167 may further include a third heat pipe 166 connecting an MCH base 169 to the first radiation block 162, and a fourth heat pipe 167 connecting the MCH base 169 to the second radiation block 163. Here, the MCH base 169 is a terminal contacting the MCHs 131 and 132.

Through addition of the third heat pipe 166 and the fourth heat pipe 167, the two radiation blocks 162 and 163 simultaneously remove heat generated from the CPU 130 and heat generated from the MCHs 131 and 132.

Figure 7:
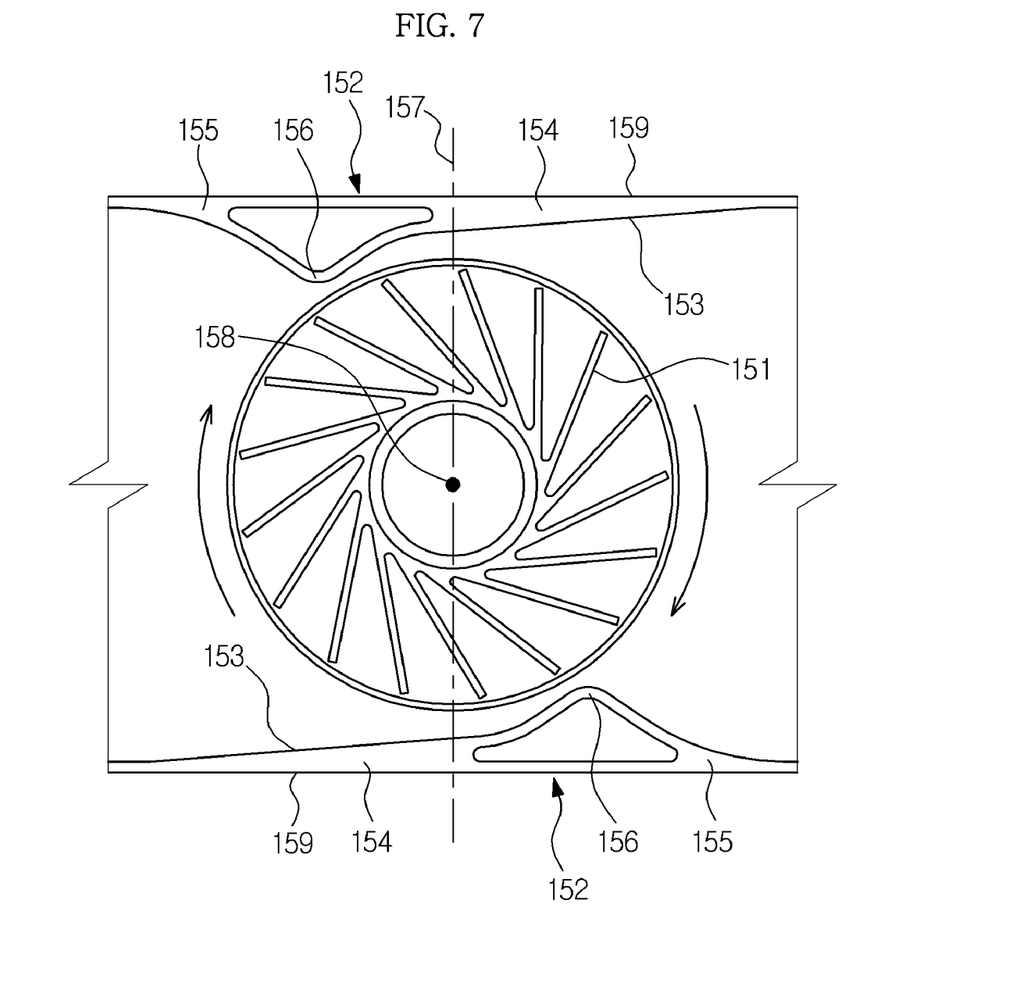
FIG. 7 is an enlarged view of a cooling fan of the cooling apparatus, an example of which is shown in FIG. 4.

FIG. 7 is an enlarged view of a cooling fan of the cooling apparatus, an example of which is shown in FIG. 4.

Hereinafter, with reference to FIGS. 4 to 7, a configuration of the scroll units 152 will be described.

The scroll units 152 are formed on the housing 141 in a shape surrounding the impeller 151 so as to guide the fluid discharged from the impeller 151 in the radial direction to the radiation blocks 162 and 163 installed in the lengthwise direction of the housing 141.

Each of the scroll units 152 includes an inner wall 153 and an outer wall 159, and the inner wall 153 is provided with a curved plane and the outer wall 159 is provided with a rectilinear plane.

Each of the scroll units 152 further includes a first scroll part 154 to guide the fluid so as to discharge the fluid while flowing in the rotating direction of the impeller 151, and a second scroll part 155 to guide the fluid so as to discharge fluid in the opposite direction to the rotating direction of the impeller 151.

A protrusion 156 protruding inwardly is formed at a point of one side of the scroll unit 152 with respect to a central line 157 passing through a rotary shaft 158 of the impeller 151. The first scroll part 154 is formed at one side of the protrusion 156 and the second scroll part 155 is formed at the other side of the protrusion 156.

The first and second scroll parts 154 and 155 are configured such that the curvature of the inner wall 153 of each of the first and second scroll parts 154 and 155 decreases with increasing distance from the protrusion 156.

Through such a configuration, a flow resistance is reduced and vortex and backflow of air are prevented. Further, the fluid may be smoothly discharged, thus reducing noise generation.

Figure 8:
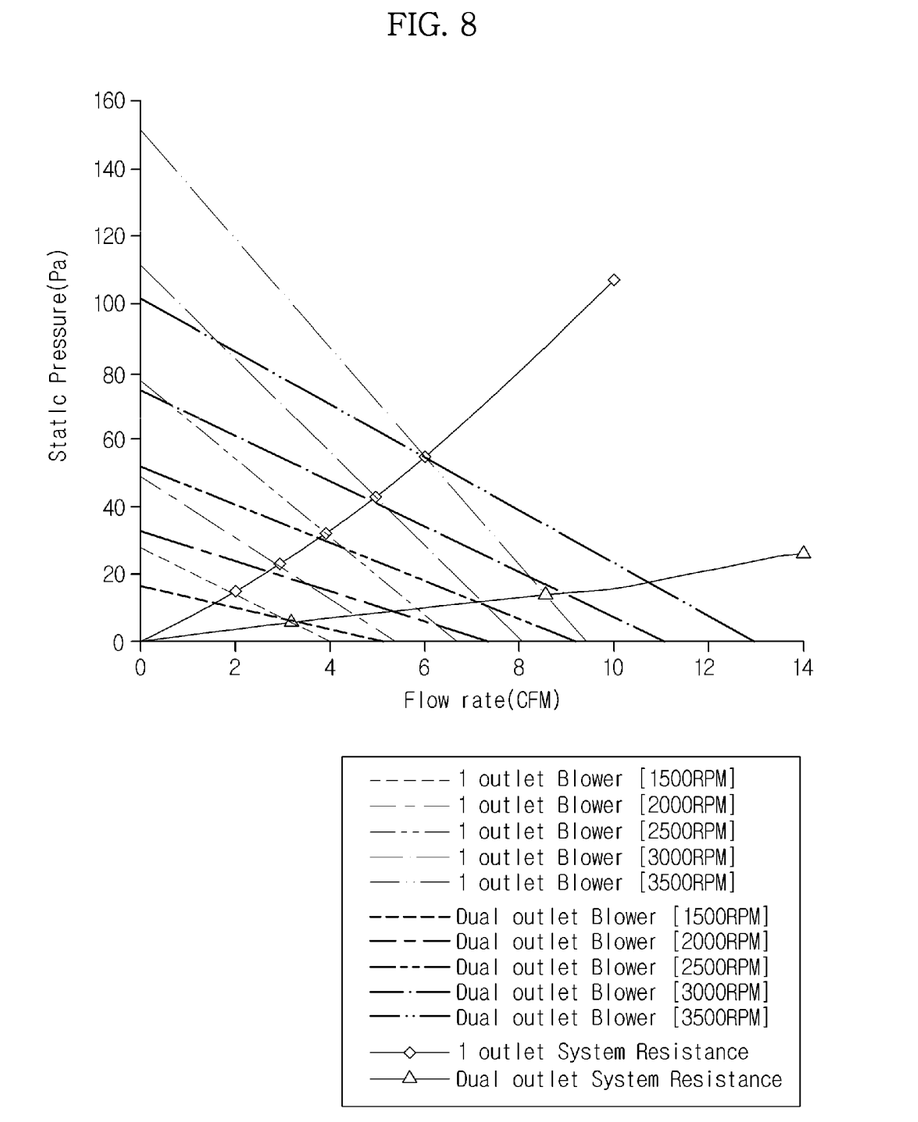
FIG. 8 is a graph illustrating a comparison between flow rate variations based on flow structures of the cooling apparatus in accordance with the exemplary embodiment of the present inventive concept and a related art cooling apparatus.
Figure 9:
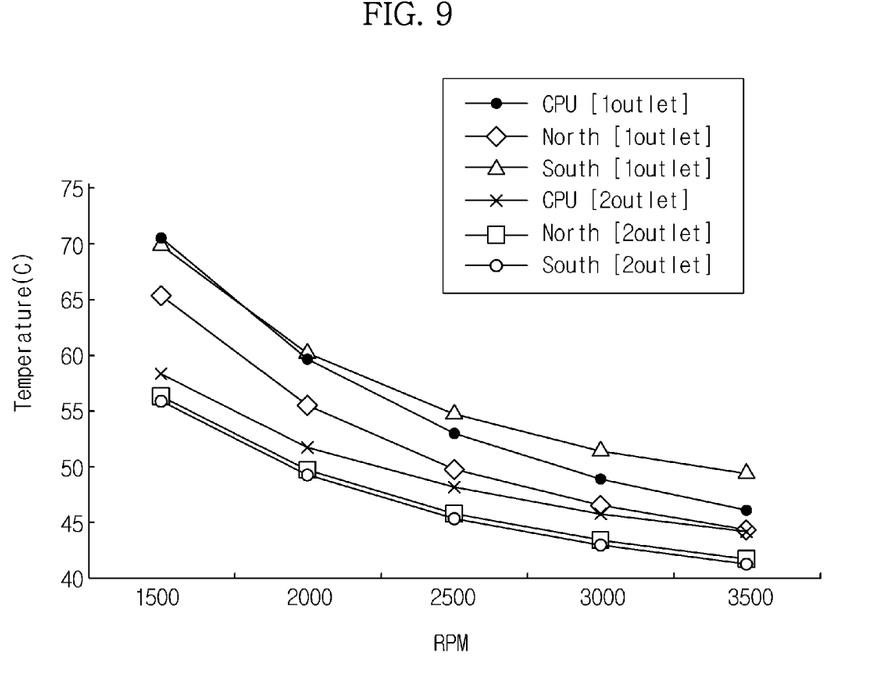
FIG. 9 is a graph illustrating a comparison between cooling capacities based on fan rotations per minute (RPMs) of the cooling apparatus in accordance with the exemplary embodiment of the present inventive concept and the related apparatus cooling apparatus.

FIG. 8 is a graph illustrating a comparison between flow rate variations based on flow structures of the cooling apparatus in accordance with the exemplary embodiment of the present inventive concept and a related art cooling apparatus, and FIG. 9 is a graph illustrating a comparison between cooling capacities based on fan RPMs of the cooling apparatus in accordance with the exemplary embodiment of the present inventive concept and the related art cooling apparatus.

In FIG. 8, the horizontal axis represents flow rate and the vertical axis represents static pressure. In FIG. 9, the horizontal axis represents RPM of the impeller 151 and the vertical axis represents temperature.

That is, compared to the related art cooling apparatus including one outlet, in the case of the cooling apparatus in accordance with the exemplary embodiment of the present inventive concept, a flow resistance is decreased and a flow rate is increased. Further, a cooling capacity is improved and thus temperatures of the CPU and the MCHs are lowered.

As is apparent from the above description, a cooling apparatus of a display device having a slim structure in accordance with one exemplary embodiment of the present inventive concept has an improved cooling capacity and reduces noise generation.

Although a few exemplary embodiments of the present inventive concept have been shown and described, it would be appreciated by those skilled in the art that changes may be made in these exemplary embodiments without departing from the principles and spirit of the invention, the scope of which is defined in the claims and their equivalents.

What is claimed is:

1. A display device having a display panel, the device comprising:
   a display panel which displays an image;
   at least one heat generating body; and
   a cooling apparatus comprising a cooling fan which discharges a fluid sucked from a front area of the cooling apparatus to both sides of the cooling apparatus, a pair of radiation blocks respectively disposed at each side of the cooling fan, wherein each radiation block includes a plurality of radiation fins and a pair of heat pipes which transmit heat generated from the at least one heat generating body to the pair of the radiation blocks,
   wherein the cooling fan includes an impeller which sucks the fluid in an axial direction, and discharges the fluid in a radial direction, and a plurality of scroll units which guide the fluid discharged from the impeller to the pair of radiation blocks.

2. The display device according to claim 1, wherein each of the scroll units includes a first scroll part which guides the fluid based on a rotating direction of the impeller, and a second scroll part which guides the fluid in a direction opposite to the rotating direction of the impeller.

3. The display device according to claim 2, wherein each of the scroll units further includes a protrusion protruding inwardly, wherein the first scroll part is at one side of the protrusion and the second scroll part is at another side of the protrusion.

4. The display device according to claim 3, wherein a curvature of an inner wall of each of the first and second scroll parts decreases with increasing distance from the protrusion.

5. The display device according to claim 1, wherein the cooling apparatus further comprises a housing on which the cooling fan and the pair of radiation blocks are disposed; and
   wherein a suction port is at a center of a front surface of the housing, and a pair of exhaust ports is at both sides of the front surface of the housing.

6. The display device according to claim 5, wherein side ends of the rear surface of the housing are curved so that the fluid is exhausted at an incline through the exhaust ports.

7. The display device according to claim 5, wherein the rear surface of the housing includes openings which expose the pair of radiation blocks to the display panel.

8. The display device according to claim 1, wherein the at least one heat generating body includes a first heat generating body and a second heat generating body, and
wherein the pair of heat pipes includes a first heat pipe and a second heat pipe.

9. A cooling apparatus comprising:
a cooling fan which discharges a fluid sucked from a front area of the cooling apparatus, to both sides of the cooling apparatus;
a pair of radiation blocks respectively disposed at each of the both sides of the cooling fan, wherein each of the radiation blocks includes a plurality of radiation fins; and
a pair of heat pipes which transmit heat generated from at least one external heat generating body to the pair of radiation blocks,
wherein the cooling fan includes an impeller which sucks the fluid in an axial direction and discharges the fluid in a radial direction, and wherein the cooling fan further includes a plurality of scroll units which guide the fluid discharged from the impeller to the pair of radiation blocks.

10. The cooling apparatus according to claim 9, wherein each of the scroll units includes a first scroll part which guides the fluid based on a rotating direction of the impeller, and a second scroll part which guides the fluid in a direction opposite to the rotating direction of the impeller.

11. The cooling apparatus according to claim 10, wherein each of the scroll units further includes a protrusion protruding inwardly, wherein the first scroll part is formed at one side of the protrusion, and wherein the second scroll part is formed at another side of the protrusion.

12. The cooling apparatus according to claim 11, wherein a curvature of an inner wall of each of the first and second scroll parts decreases with increasing distance from the protrusion.

13. A cooling apparatus comprising:
an impeller which sucks a fluid in an axial direction, and which discharges the fluid in a radial direction;
a pair of radiation blocks, which are respectively disposed at each side of the impeller, wherein each of the radiation blocks includes a plurality of radiation fins; and
a plurality of scroll units which guide the fluid discharged from the impeller to the pair of radiation blocks,
wherein each of the scroll units includes a first scroll part which guides the fluid based on a rotating direction of the impeller, and a second scroll part which guides the fluid in a direction opposite to the rotating direction of the impeller.

\* \* \* \* \*